(12) United States Patent
Occhi et al.

(10) Patent No.: US 8,022,389 B2
(45) Date of Patent: Sep. 20, 2011

(54) LIGHT SOURCE, AND DEVICE

(75) Inventors: Lorenzo Occhi, Pfaffikon (CH); Valerio Laino, Zurich (CH); Christian Velez, Richterswil (CH)

(73) Assignee: Exalos AG, Schlieren (CH)

( * ) Notice: Subject to any disclaimer, the term of this patent is extended or adjusted under 35 U.S.C. 154(b) by 5 days.

(21) Appl. No.: 12/610,705

(22) Filed: Nov. 2, 2009

(65) Prior Publication Data
US 2010/0193769 A1    Aug. 5, 2010

Related U.S. Application Data

(63) Continuation-in-part of application No. PCT/CH2008/000194, filed on Apr. 29, 2008.

(60) Provisional application No. 60/915,159, filed on May 1, 2007.

(51) Int. Cl.
*H01L 29/06* (2006.01)
*H01L 31/00* (2006.01)

(52) U.S. Cl. ....... 257/13; 257/95; 257/98; 257/E33.008; 257/E33.048; 257/E33.054; 257/E33.067

(58) Field of Classification Search .............. 257/13, 257/95, 98, E33.008, E33.048, E33.054, 257/E33.067
See application file for complete search history.

(56) References Cited

U.S. PATENT DOCUMENTS

| | | | |
|---|---|---|---|
| 6,600,175 B1 | 7/2003 | Baretz et al. | |
| 7,211,822 B2 | 5/2007 | Nagahama et al. | |
| 2004/0065890 A1* | 4/2004 | Alphonse et al. | 257/94 |
| 2004/0247275 A1* | 12/2004 | Vakhshoori et al. | 385/129 |
| 2005/0127394 A1 | 6/2005 | Nagahama et al. | |
| 2005/0161685 A1* | 7/2005 | Velez et al. | 257/85 |
| 2005/0279989 A1* | 12/2005 | Li et al. | 257/13 |
| 2006/0086941 A1 | 4/2006 | Han et al. | |
| 2007/0029541 A1* | 2/2007 | Xin et al. | 257/14 |

OTHER PUBLICATIONS

Liu, Deming et al.; "A Novel Semiconductor White Light Emitting Diode"; Physics and Simulation of Optoelectronic Devices XIII; Jan. 24, 2005; San Jose, California; Proceedings of the SPIE, Apr. 28, 2005; vol. 5722, No. 1; pp. 550-556; XP002493204.

* cited by examiner

Primary Examiner — Tu-Tu Ho
(74) Attorney, Agent, or Firm — Rankin, Hill & Clark LLP

(57) ABSTRACT

In accordance with the invention, a light source for display and/or illumination is provided, the light source comprising a heterostructure including semiconductor layers, the heterostructure forming a waveguide between a first end and a second end, the heterostructure comprising a plurality of layers and comprising an optically active zone formed by the plurality of layers, the optically active zone capable of emitting light guided by said waveguide, at least two different radiative transitions being excitable in the optically active an electrical current between a p-side electrode and an n-side electrode, transition energies of said at least two different radiative transitions corresponding to wavelengths in the visible part of the optical spectrum, the light source further comprising means for preventing reflections of light from the waveguide by at least one of said first and second end back into the waveguide, thereby causing the light source to comprise a superluminescent light emitting diode.

21 Claims, 4 Drawing Sheets

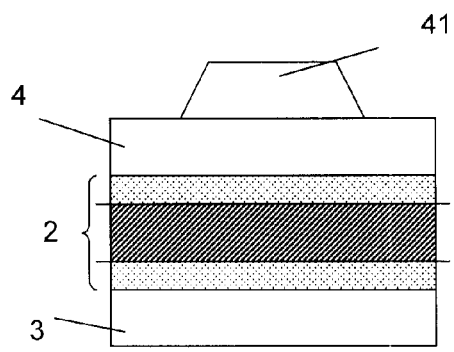
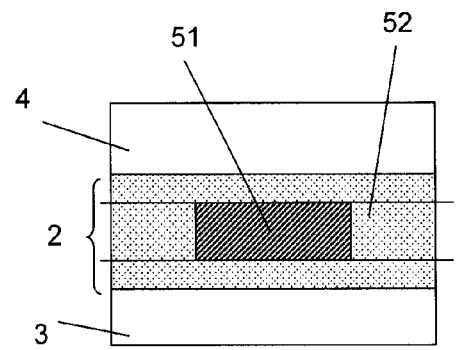
Fig. 4          Fig. 5
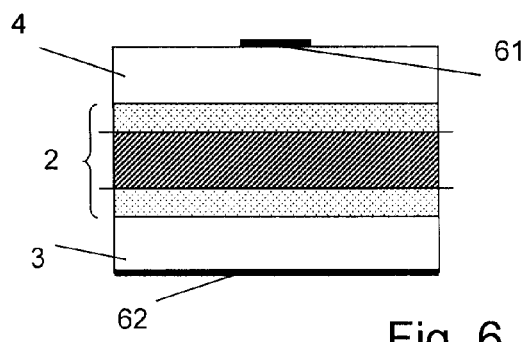
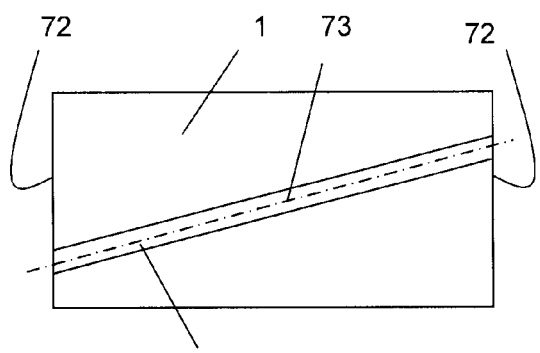
Fig. 6          Fig. 7
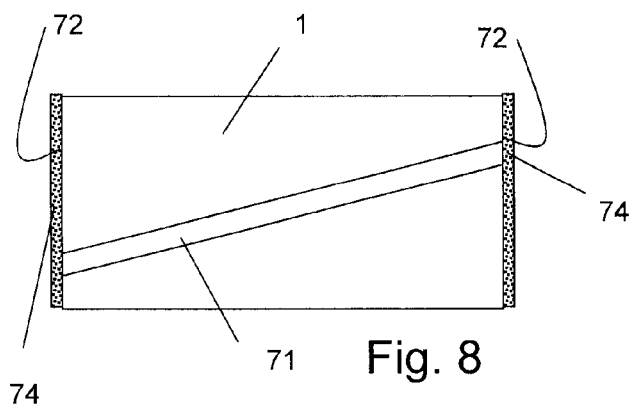
Fig. 8

LIGHT SOURCE, AND DEVICE

BACKGROUND OF THE INVENTION

1. Field of the Invention

The invention is in the field of light sources providing visible light for display and/or illumination purposes and more particularly relates to a semiconductor light source.

2. Description of Related Art

Semiconductor light sources offer a much longer lifetime compared to conventional lamps, smaller form factor and better energy conversion efficiency, suggesting lower power bills. Among semiconductor sources of visible light, Light Emitting Diodes (LEDs) and Laser Diodes (LDs) are well-known and popular. All state of the art semiconductor-based light sources on the market can be classified in these two main categories:

light emitting diodes (LEDs), produce an incoherent light with a relatively broad spectrum.

light amplifiers by means of stimulated emission of radiation (lasers), produce a narrow spectrum and highly coherent light beam; a narrow waveguide confines the electromagnetic radiation resulting in good in-fiber coupling of the light, i.e. high spatial coherence.

LEDs are popular for illumination as well as for traffic lights, low power displays etc. LEDs however, offer a comparably small optical output power only. To overcome this problem, the emitting area is usually enlarged, increasing the surface of the device. However, for applications requiring a collimation of the light beam, this is disadvantageous. The large emitting area results in problems with collimating the emitted light beam, and the beam quality deteriorates with the die size. Therefore, light cannot be efficiently coupled to an optical element such as a waveguide or a light modulator etc. Optical output power is another concern. The current state-of-the-art of high brightness LED suggests that a device pushing 1,000 lumens out at the lens is not foreseeable for the next 4-5 years. This means that especially high output power projection devices will not be realizeable using LED light sources.

Laser diodes (LDs), however, offer high power, compact design, good energy conversion into light and good coupling efficiency to external optical systems, i.e. high spatial coherence. LDs have a well-defined emission wavelength and can be designed for different wavelengths of the optical spectrum. As every color (including white) the human can perceive may be represented by a superposition of light contributions in three main wavelengths (446 nm, 532 nm and 629 nm), LDs seem an ideal candidate to generate color displays by just combining three laser sources. With this technique, it is ideally possible to complete the whole color gamut.

However, in practice it has been found that the color impression from laser displays is not perceived to be ideal by humans. For this reason, energy consuming broadband light sources such as Xenon lamps still prevail on the market of display light sources. A further problem of laser light for displays is speckle formation. Speckles are due to an interference effect caused by the high coherence of light sources and cause distortions of the resulting displayed image. State of the art laser display systems for this reason include laborious and costly means for reducing light coherence such as light tunnels. Yet another disadvantage of laser displays is the polarization of the output light that for many display applications is undesired. Therefore, laser displays often include depolarizers.

As semiconductor materials for blue and green LEDs and LDs, GaN based compounds have been proposed. As an example, US patent application publication 2005/0127394 discloses nitride semiconductor devices with an active layer and super lattice cladding layers. In the publication, the structure is mentioned to be suitable for both, LEDs and LDs as well as superluminescent light emitting diodes, which as such are known for the generation of infrared radiation with a high linewidth or as (less ideal) replacement of lasers at wavelengths, where no suitable mirrors are available.

BRIEF SUMMARY OF THE INVENTION

It is an object of the present invention to provide a light source that overcomes drawbacks of prior art light sources and that especially is suited for display and illumination systems.

In accordance with a first aspect of the invention, a light source for display and/or illumination is provided, the light source comprising a heterostructure including semiconductor layers, the heterostructure forming a waveguide between a first end and a second end, the heterostructure comprising a plurality of layers and comprising an optically active zone formed by the plurality of layers, the optically active zone capable of emitting light guided by said waveguide, at least two different radiative transitions being excitable in the optically active, an electrical current between a p-side electrode and an n-side electrode, transition energies of said at least two different radiative transitions corresponding to wavelengths in the visible part of the optical spectrum (and especially corresponding to wavelengths shorter than 600 nm). The light source further comprising means for preventing reflections of light from the waveguide by at least one of said first and second ends back into the waveguide, thereby causing the light source to comprise a superluminescent light emitting diode.

In this, the term "superluminescent light emitting diode" is firstly used to refer to a device that is designed specifically for the purpose of acting as SLEDs. Secondly, superluminescent light emitting diodes also comprise devices designed to be Semiconductor Optical Amplifiers (SOAs), including reflective SOAs (R-SOAs) but operated or suitable to be operated as light sources. R-SOAs comprise one reflective end facet reflecting light portions propagating towards the one reflective end facet to be reflected back into the waveguide, the light then being output through the other end facet that has the antireflection design element(s).

Devices that are designed only for the purpose of acting as SLEDs as well as SOAs may have a structure similar to laser diodes. They have a waveguide and an electrically pumped gain structure, but with at least one anti-reflection element that prevents resonator modes from occurring. SOAs are originally designed for amplifying incoming radiation by means of stimulated emission. If operated without any incoming radiation or when only a constant, broadband, low intensity incoming radiation generated by spontaneous emission (either in a semiconductor device or in an other kind of light source) impinging on it, they act as superluminescent light sources and thus are SLEDs.

In this text, "SLED" or "SLED device" is generally used to refer to any kind of light source that comprises a semiconductor heterostructure gain region, being based on amplified spontaneous emission, and essentially not having any laser modes (i.e. amplified spontaneous emission dominates). In addition to SOAs and R-SOAs operated as superluminescent light sources, SLEDs for example also include devices originally designed as Edge Emitting LED (EELED) devices with a waveguide, which devices are operated as SLEDs, i.e. if superluminescence is used in a substantial manner.

The optically active zone preferably comprises only homogeneous layers (potentially horizontally structured), i.e. preferably does not comprise any quantum size dots or stripes. Homogeneous in the sense of this text means that there are no grains or the like of a size that could cause quantum effects due to horizontal confinement (i.e. confinement in the layer plane). This is because it has been found that quantum dots of materials emitting in the visible part of the optical spectrum are difficult to electrically contact and therefore are only suitable for optical pumping. The light source according to the invention, however, relies on electrical pumping.

The light source is for display and/or illumination purposes, thus it may comprise additional means qualifying it for this purpose:

The light source may comprise a casing that includes light re-directors (such as a parabolic or otherwise curved mirror, a collimation lens etc.);

The light source may comprise light shields (such as a shade);

It may include a color conversion dye, for example for producing white light;

The light source may comprise a casing/and or mount including secondary contacts such as contact pins/lead wires or SMD contact pads, the secondary contacts being connected to the (primary) contacts of the heterostructure;

A grip or handle may be provided, for example if the light source serves as a pointer;

Mounting means and a collimation optics may be present if the light source is provided as part of a display device.

The invention also concerns according uses of the light source for display and illumination purposes, i.e. methods of displaying information and/or of illuminating an object including the step of generating light by a light source according to the invention.

The at least two different radiative transitions may, according to a first variant, be transitions in different regions of the optically active zone. For example, the optically active zone may comprise a plurality of quantum wells with barrier layers between them, each quantum well defining an optically active region, the quantum wells having different energy levels because of at least one of different material compositions, of different thickness, of different material growth properties, and of other reasons causing energy level differences in the quantum wells to be different between the quantum wells.

As another embodiment of the first variant, the optically active zone may comprise layers of different composition and/or having a transition gradient. According to yet another embodiment, the optically active zone may comprise quantum dots and/or quantum wires of different sizes and/or different compositions, in an intermingled manner or in different regions.

The at least two different radiative transitions may, according to a second variant, be due to the excitation of charge carriers in the optically active zone into at least two energy levels different from the ground state, so that the (radiative) transition back into the ground state (or a lower excited state) of the different charge carrier yields at least two different photon energies. The excitation of two radiative transitions can for example be done by tuning the electronic structure of semiconductor material sandwiching an optically active layer and the optically active material itself so that the charge carriers injected in the optically active layer populate at least two energy states in the conduction band or two energy states in the valence band or both with a significantly high density to induce a radiative recombination of the carriers between these states that occurs at different wavelengths giving the desired effect; the distance in energy between the transition is usually not too large in this case otherwise no significant population inversion can be reached in the higher-energy state to have significant radiative recombination from it. Examples of material combinations in which this could be done include InGaN quantum wells with low-Indium content.

The waveguide may either be index guided or gain guided or both. An index guided waveguide includes a transversal structuring of material in which the light within the device is guided in a manner that in a waveguiding region, the refractive index is higher than in a region around it. For example, a ridge may be provided on the device, or a (buried) strip of higher index material may be present guiding the light. A gain guided device includes a transversal structuring of the current flow by having electrodes and/or insulating layers preventing a current from flowing transversally structured.

The means for preventing reflections may include at least one of,

A. an antireflective (AR) coating

B. an end facet of said waveguide being at an oblique angle to a waveguide direction, C. the waveguide comprising a taper, whereby the waveguide is broadened or narrowed towards at least one of said ends, and of D. an absorber region including a structure absorbing light of at least one of said first and second wavelengths.

Referring to condition B. the waveguide direction—as is known in the art—may for example be defined as the direction of a central axis of a light beam guided in the waveguide; the waveguide direction is defined by the structuring of the waveguiding material and/or the current confinement, respectively. An oblique angle means an angle different from 0° and from 90°, thus the waveguide direction in accordance with condition B. is not parallel to a direction perpendicular to said end facet.

Preferably, at least an end facet is at an oblique angle to a waveguide direction and at least one of the other measures (AR coating, tapered waveguide, absorber region) is taken.

In accordance with a special embodiment, at least conditions B. and C., and optionally at least one further condition are fulfilled.

According to a special embodiment, a central emission wavelength of the light source is between 400 nm and 600 nm or between 400 nm and 560 nm (thus blue or green).

It has been found by the inventors that nitride compounds are especially suited as materials for the broadband source of visible light according to the invention, especially as a source of blue and green light. More concretely, the heterostructure may include a GaN based material, such as $In_xGa_{1-x}N$ for with $0 \leq x < 1$ or $Al_xGa_{1-x}N$. For example, an optically active layer may be of an $In_xGa_{1-x}N$ material with x between 0.05 and 0.35. Another suitable group of materials are Zinc Oxides.

In this text, terms like "vertical", "horizontal", "transversal", "longitudinal" etc. are used. These terms generally refer to the layer structure of layers grown on some substrate, i.e. horizontal denotes any direction parallel to the layer plane, and "vertical" a direction perpendicular thereto. This is, of course, independent of the actual orientation of the light source in its final destination. "longitudinal" and "transversal" are horizontal directions, "longitudinal" being parallel the waveguiding direction.

BRIEF DESCRIPTION OF THE DRAWINGS

The foregoing and other features and advantages of the invention will be further described in the following more particular description of preferred embodiments of the invention as illustrated in the accompanying drawings. The drawings are all schematic and not to scale. In the drawings, same reference numerals refer to same or corresponding elements.

FIG. 4 shows a first variant of index guiding;

FIG. 5 shows a second variant of index guiding;

FIG. 6 illustrates a gain guided structure;

FIG. 7 depicts a tilted waveguide;

FIG. 8 illustrates a tilted waveguide with AR coating;

DESCRIPTION OF THE PREFERRED EMBODIMENTS

Figure 1:
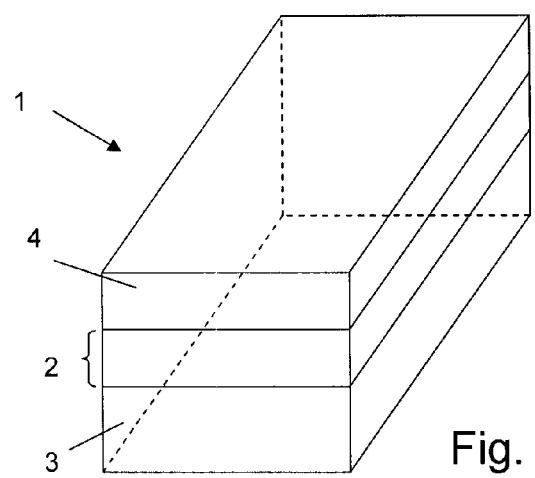
FIG. 1 is a schematic view of an SLED according to the invention.

The SLED 1 a layer structure of which is illustrated in FIG. 1 and comprises an optically active zone 2 between a first cladding layer 3 and a second cladding layer 4. For example, the first cladding layer may be made of a semiconductor material of a first conductivity type (for example an n-doped semiconductor), and the second cladding layer may be of a second conductivity type (such as a p-doped semiconductor). In a particular example, the first cladding layer 3 may be made of GaN doped by a donor type impurity such as Si, whereas the second cladding layer may be made of GaN doped by an acceptor type impurity such as Mg. The structure may be provided on a substrate (not shown) of a suitable material. The substrate may be conducting (for example n-type conducting), in which case a first contact electrode may be arranged on a bottom side of the substrate. The substrate may alternatively be electrically insulating, in which case a contact layer may be arranged between the first cladding layer 3 and the substrate, and a contact electrode (not shown) contacting the contact layer may be located at a lateral distance to the waveguide. Ways of contacting a heterostructure by appropriate electrodes are known in the art and will not be described in any further detail here.

The optically active zone 2 may comprise one or more optically active regions, as will be explained in more detail referring to the following figures. The optically active zone is capable of producing visible light upon injection of an electric current in a vertical direction. More concretely, the layer structure includes an at least partially horizontal waveguide so that light travelling along the waveguide is produced and amplified, by means of stimulated emission.

Figure 2:
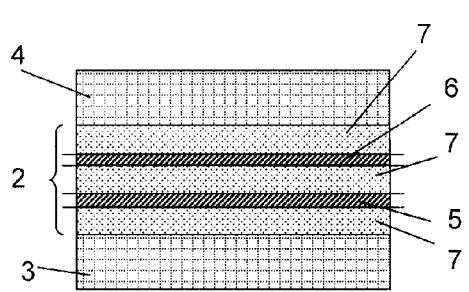
FIG. 2 is a cross section of a layer structure of a first embodiment of the SLED according to the invention.

The optically active zone 2 in the structure according to FIG. 2 includes a plurality of (i.e. at least two) optically active regions. The optically active regions in FIG. 2 are formed by two distinct optically active layers 5, 6 spaced from each other in a vertical direction. Between the optically active layers 5, 6 and potentially also adjacent the optically active layers, there are barrier layers. The optically active layers have a smaller bandgap than the surrounding barrier layers (and, if at least one optically active layer is directly adjacent a cladding layer, also than the cladding layer).

The optically active layers may be quantum well layers. This is the case if the barrier layers have a lower index of refraction than the active layers and the wavelength of the charge carriers is of the same order of magnitude as the layer thickness. More concretely, the thickness of the active layers 5, 6 may, for example, be less than 0.02 µm. The thickness of the barrier layer 7 between the quantum well layers is in most of the cases higher than the thickness of the quantum well layers themselves. Instead of the shown two quantum well layers, also three, four or more quantum well layers may be present.

In the shown embodiment, the bandgaps of the different optically active regions is not equal. More concretely, at least one of the layer thickness (accounting for the levels of energy subbands) and of the semiconductor material composition (accounting for the 3D "bulk" energy band structure) is different between two different layers. In FIG. 2, a first: quantum well layer 5 is illustrated to be wider than a second quantum well layer 6.

The barrier layers 7 may, for example, be of GaN, and the active layers 5, 6 may be of $In_xGa_{1-x}N$ with x between 0.05 and 0.2 for blue light emission and between 0.2 and 0.35 for green light emission. Both, the barrier layers and the active layers may be undoped, i.e. need not comprise any purposeful doping. For x>0.2 some segregation may occur; for example In islands may be formed. The segregation may be reduced by appropriate growth parameters, for example by growing the $In_xGa_{1-x}N$ layer at reduced temperature. Also, the segregation may be reduced if the active layers—then being quantum well layers—are of a small thickness. For example, a large number (4 or more) quantum well layers each of a small thickness and with at least two different thicknesses and/or at least two different material compositions (for example x values) may be chosen.

Figure 3:
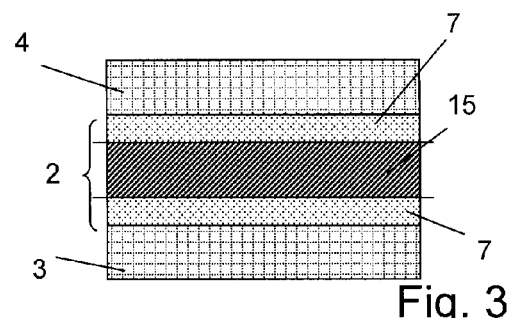
FIG. 3 is a cross section of a layer structure of a first embodiment of the SLED according to the invention.

The embodiment of FIG. 3 is distinct from that of FIG. 2 in that it comprises only one active layer 15 that in the shown configuration is not a quantum well layer. The energy structure relationship between the cladding layers 3, 4, the barrier layers 7 and the active layer 15 is such that more than one radiative transition can be excited in the optically active layer. One can, for example, make a very large quantum well with many transition states available. Then, one has to excite those transition states by increasing the carrier density so that the population of the higher energy states is high enough to have considerable transition level.

As an alternative to the shown configuration of FIG. 3, the single active layer could also be a quantum well layer. As yet another alternative, the structure may comprise a plurality of optically active layers (such as quantum well layers) all emitting or at least some of them emitting at the same wavelengths (i.e. having the same bandgap; for example equal wells).

FIG. 4 illustrates the principle of an index guided waveguide. The optically active zone 2 may be formed as in any one of the previous embodiments or as in any other embodiment of the invention. The structure comprises a ridge defining a waveguide with a waveguide direction out of the picture plane. If the second cladding layer 4 is not too thick, such a ridge will laterally confine light and cause a light beam to propagate along the waveguide. In the literature, this approach is often called weakly index guided or ridge waveguided.

Another example of an index guided waveguide is illustrated in FIG. 5, where the optically active zone 2—and/or another region in which the light produced in the optically active zone propagates, such as at least one of the cladding layers—comprises a laterally confined layer 51 of an index of refraction that is higher than the index of refraction of confining layers 52 of another material. Such a structure is also called "buried structure waveguide".

A gain guided structure is shown in FIG. 6. The second (top) electrode 61 is strip-shaped so that the vertical current is laterally confined, thus confining the region where the optically active region may emit light. This also causes the light to be guided along the strip, namely along a waveguiding direction.

Other ways of defining a waveguide by index guiding and/or gain guiding are known in the art and will not be described in any more detail here.

FIG. 7 illustrates—in a schematical top view of a SLED 1—a possible waveguide configuration. The SLED body is approximately rectangular (in a horizontal section), with end faces, and the waveguide direction 73 is at an angle to the end faces and to the normal direction thereto. Due to this, and facets of the waveguide (in the shown configuration, the end facets correspond to sections of the end faces corresponding to the intersection of the guided light with the end faces) are at an oblique angle to the waveguide direction, and thus light travelling along the waveguide is not reflected, by the end facets, back into the waveguide, but travels away from the waveguide.

Figure 9:
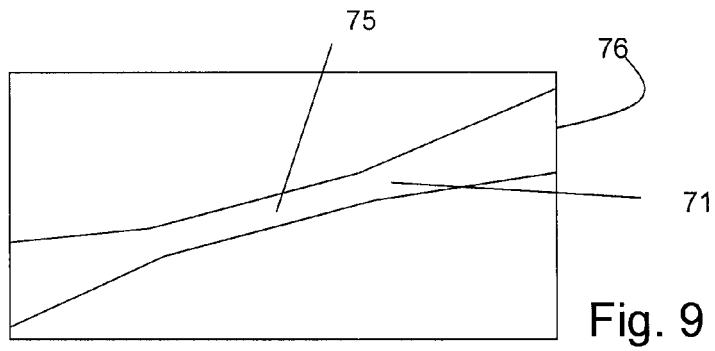
FIG. 9 illustrates a tilted waveguide with taper.

At least one of the end facets in the configuration according to FIG. 8 further comprises an antireflective (AR) coating 74. In the shown embodiment, both entire end faces 72 are AR coated, but it would be sufficient to coat only the sections corresponding to the end facets. The AR coating(s) further contribute(s) to the prevention of light travelling back and forth a plurality of times within the SLED 1 body. AR coatings as such are known in the art. They may, for example, be constituted by a dielectric layer, the index of refraction of which corresponds to the geometric mean between the index of refraction of the waveguiding material and the surrounding medium and the thickness of which is a quarter of a wavelength. Alternative embodiments of AR coatings, for example comprising a plurality of layers, that as such are known in the art, may also be used. The configuration of FIG. 9 in addition to the oblique end facets comprises a waveguide taper. The waveguide 71 in vicinity to the end facets becomes broader close to the end facet (it is flared, for example linearly flared, between a straight middle portion 75 and the end facets 76). As an alternative, the waveguide could also become narrower. By this taper, the light portions reflected back into the waveguide are further reduced. The taper of FIG. 11 can further be combined with an AR coating as in FIG. 10.

Figure 10:
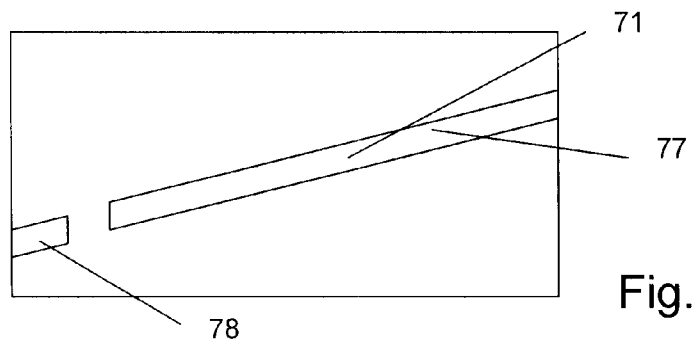
FIG. 10 illustrates a tilted waveguide with absorber region.

Embodiments designed analogously to the SLED embodiments of the previous figures may, if further comprising means for causing a primary light to impinge from the back side, also act as SOAs. The invention includes devices designed to be Semiconductor Optical Amplifiers (SOAs), including reflective SOAs (R-SOAs) but operated as superluminescent light sources. FIG. 10 shows a waveguide structure where the waveguide 71 comprises an active section 77, where the optically active zone is electrically pumped as described above, and further comprises an absorber section 78, where the material in the waveguide is such as to absorb light of the wavelength emitted in the active section. For example, in the absorber section 78 the semiconductor structure may be reverse biased or unbiased. Especially, the p and n side of the junction may be electrically connected as, for example, described in WO 2005/071 762 incorporated herein by reference.

Figures 11, 12:
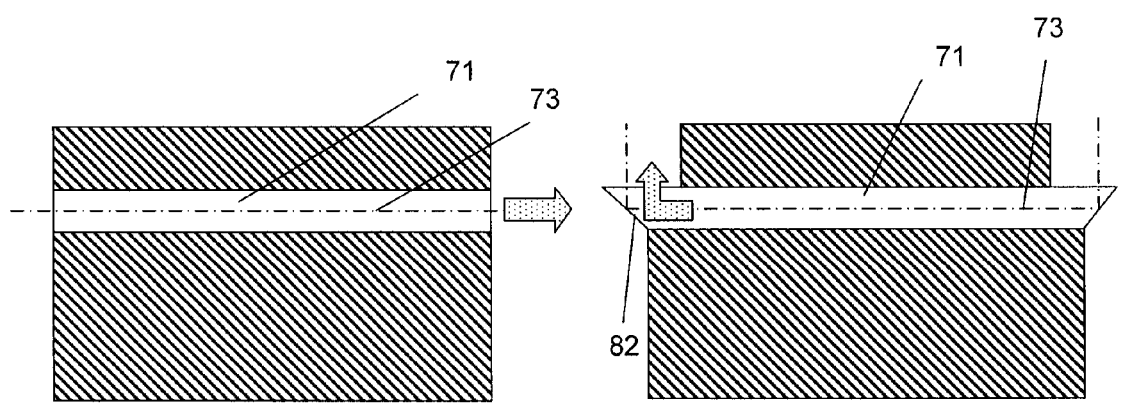
FIG. 11 shows the principle of edge emission.
FIG. 12 illustrates the principle of surface emission.

The light in the SLED is guided by a waveguide. In most embodiments, the SLED is edge emitting as illustrated in FIG. 11 where the end facet of the waveguide 71 is perpendicular to the layer plane. An alternative is shown in FIG. 12 where an in-plane portion 81 of the waveguide is terminated by a reflecting structure 82 forming an angle with respect to the layer plane to direct the beam into a vertical direction so as to make the SLED surface emitting.

Figure 13:
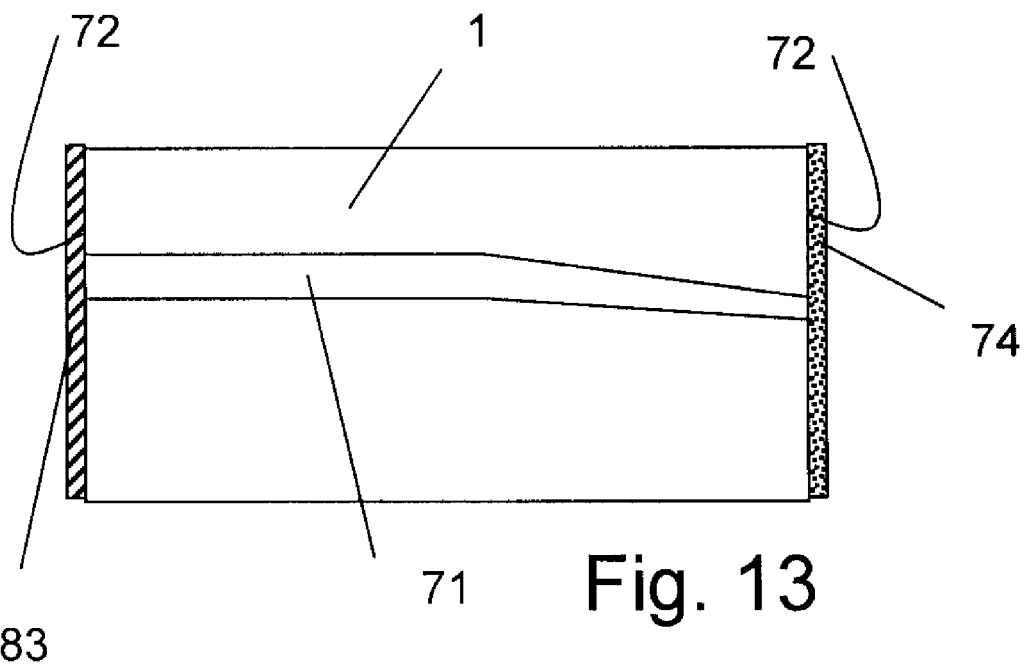
FIG. 13 illustrates a semiconductor SLED device having the structure of an R-SOA.

FIG. 13 yet illustrates a semiconductor SLED device 1 having the structure of an R-SOA with one reflective end facet with a reflective coating 83 and one non-reflective end facet with an AR coating 74. The waveguide 71 further comprises a taper towards the non-reflective end facet. If primary light would be coupled into the waveguide from the non-reflective end facet, it is amplified on its path to the reflective coating and back from the reflective coating to the non-reflective end facet, from where it is coupled out. The device acts as SLED either if spontaneously emitted primary light (thus no laser light) is coupled in from the non-reflective end facet. In a preferred SLED operation regime, no light is coupled in in substantial amounts, and spontaneous emission within the gain region is used to be amplified by stimulated emission. Light portions that are spontaneously emitted into the 'back' direction (i.e. towards the reflective coating 83) are, while being amplified during the passing of the gain zone, reflected back from the reflective coating into the waveguide and are then coupled out through the non-reflective end facet like portions emitted into the "forward" direction. Various other embodiments may be envisaged without departing from the scope and spirit of the invention.

What is claimed is:

1. A light source of visible light for display and/or illumination, the light source comprising a heterostructure including semiconductor layers, the heterostructure forming a waveguide between a first end and a second end, the heterostructure comprising a plurality of layers and comprising an optically active zone formed by the plurality of layers, the optically active zone capable of emitting light guided by said waveguide, at least two different radiative transitions being excitable in the optically active zone by an electrical current between a p-side electrode and an n-side electrode, transition energies of said at least two different radiative transitions corresponding to wavelengths in the visible part of the optical spectrum, wherein the optically active zone comprises at least one optically active region with multiple radiative transitions, whereby at least two different radiative transitions include transitions between at least three different energy levels in a single material of said optically active region, the light source further comprising means for preventing reflections of light from the waveguide by at least one of said first and second end back into the waveguide, thereby causing the light source to comprise a superluminescent light emitting diode.

2. The light source according to claim 1, wherein said means for preventing reflections include at least one of,
   an antireflective coating
   an end facet of said waveguide being at an oblique angle to a waveguide direction,
   the waveguide comprising a taper, whereby the waveguide is broadened or narrowed towards at least one of said ends,
   an absorber region including a structure absorbing light of at least one of said first and second wavelengths.

3. The light source according to claim 1, wherein the waveguide is index guided.

4. The light source according to claim 1, wherein the waveguide is gain guided.

5. The light source according to claim 1, wherein the optically active zone includes a nitride semiconductor material that includes Gallium.

6. The light source according to claim 5, wherein the nitride semiconductor material including Gallium is $In_xGa_{1-x}N$ with $0 \leq x < 1$.

7. The light source according to claim 6, wherein x is between 0.05 and 0.35.

8. The light source according to claim 1, wherein the optically active zone includes Zinc Oxide semiconductor material.

9. The light source according to claim 1, wherein the superluminescent light emitting diode is a semiconductor optical amplifier (SOA) operated to amplify spontaneously emitted light.

10. The light source according to claim 1, wherein the waveguide is both, gain guided and index guided.

11. The light source according to claim 1, wherein the optically active zone includes $Al_xGa_{1-x}N$ semiconductor material with $0 \leqq x < 1$.

12. The light source according to claim 1, wherein the light source has a central emission wavelength of between 400 nm and 600 nm or between 400 nm and 560 nm.

13. The light source according to claim 1, wherein the at least one optically active region being at least one well layer.

14. The light source according to claim 1, wherein the at least one optically active region being at least one layer, being not a quantum well layer.

15. The light source according to claim 1, further comprising a casing including at least one light redirector.

16. The light source according to claim 1, further comprising a casing including at least one light shield.

17. The light source according to claim 1, further comprising a conversion dye.

18. The light source according to claim 1, further comprising a grip or a handle.

19. A display and/or illumination device the device comprising a light source, the light source comprising a heterostructure including semiconductor layers, the heterostructure forming a waveguide between a first end and a second end, the heterostructure comprising a plurality of layers and comprising an optically active zone formed by the plurality of layers, the optically active zone capable of emitting light guided by said waveguide, at least two different radiative transitions being excitable in the optically active an electrical current between a p-side electrode and an n-side electrode, transition energies of said at least two different radiative transitions corresponding to wavelengths in the visible part of the optical spectrum, the light source further comprising means for preventing reflections of light from the waveguide by at least one of said first and second end back into the waveguide, thereby causing the light source to be a superluminescent light emitting diode, wherein the optically active zone comprises at least one optically active region with multiple radiative transitions, whereby at least two different radiative transitions include transitions between at least three different energy levels in a single material of said optically active region.

20. The display and/or illumination device according to claim 19, wherein the superluminescent light emitting diode is a semiconductor optical amplifier (SOA) operated to amplify spontaneously emitted light.

21. The display and/or illumination device according to claim 19, wherein the light source comprises mounting means and a collimation optics.

* * * * *